(12) United States Patent
Goh et al.

(10) Patent No.: US 11,730,049 B2
(45) Date of Patent: Aug. 15, 2023

(54) DISPLAY DEVICE

(71) Applicant: Samsung Display Co., Ltd., Yongin-si (KR)

(72) Inventors: Ye Chan Goh, Hwaseong-si (KR); Byung Hoon Chae, Asan-si (KR); Gil Jae Choi, Cheonan-si (KR); Seung Kyun Hong, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 129 days.

(21) Appl. No.: 16/293,504

(22) Filed: Mar. 5, 2019

(65) Prior Publication Data
US 2019/0319201 A1 Oct. 17, 2019

(30) Foreign Application Priority Data
Apr. 16, 2018 (KR) .................. 10-2018-0044136

(51) Int. Cl.
*B32B 3/26* (2006.01)
*H10K 77/10* (2023.01)
*B32B 3/30* (2006.01)
*H10K 59/131* (2023.01)
*H10K 50/844* (2023.01)
*H10K 102/00* (2023.01)

(52) U.S. Cl.
CPC ............ *H10K 77/111* (2023.02); *B32B 3/263* (2013.01); *B32B 3/30* (2013.01); *H10K 59/131* (2023.02); *H10K 50/844* (2023.02); *H10K 2102/311* (2023.02)

(58) Field of Classification Search
CPC .. B32B 3/02; B32B 3/26; B32B 3/263; B32B 3/266; B32B 3/30; B32B 7/02; B32B 7/04; B32B 7/12; B32B 2457/20; B32B 2457/206; B32B 2457/208; B32B 2307/20; H01L 51/0097; H01L 51/5293; H01L 2251/5338; G02B 26/005; G02F 1/167; Y10T 428/24273; Y10T 428/24298; Y10T 428/24314; Y10T 428/24322; Y10T 428/24479; Y10T 428/24521; Y10T 428/24612; Y10T 428/2462; Y10T 428/24942; Y10T 428/2495
USPC .......................... 428/99, 156–173, 212, 213
See application file for complete search history.

(56) References Cited

U.S. PATENT DOCUMENTS

| 9,051,493 B2 * | 6/2015 | Bower .................. B32B 27/32 |
| 10,056,444 B2 * | 8/2018 | Cho .................... H01L 27/3258 |
| 2018/0013095 A1 | 1/2018 | Choi et al. |

FOREIGN PATENT DOCUMENTS

KR 10-2017-0107122 9/2017

OTHER PUBLICATIONS

Korean Office Action dated Oct. 1, 2022, in Korean Patent Application No. 10-2018-0044136.

* cited by examiner

*Primary Examiner* — Megha M Gaitonde
(74) *Attorney, Agent, or Firm* — H.C. Park & Associates, PLC

(57) ABSTRACT

A display device having a display area and a non-display area disposed in the vicinity of the display area and including a bending area, the display device includes: a substrate; a first organic insulating layer disposed on the substrate; and a trench structure disposed in the non-display area, the trench structure including sidewalls formed by the first organic insulating layer and a bottom surface located in the bending area, wherein the bending area is disposed on a side of the display area.

12 Claims, 10 Drawing Sheets

\<Pressure Test\>

\<Impact Test\>

DISPLAY DEVICE

This application claims priority from and the benefit of Korean Patent Application No. 10-2018-0044136, filed on Apr. 16, 2018, which is hereby incorporated by reference for all purposes as if fully set forth herein.

BACKGROUND

FIELD

Exemplary embodiments of the invention relate generally to a display device and, more specifically, to an organic light-emitting display device having a bending area.

DISCUSSION OF THE BACKGROUND

An organic light-emitting display device using organic light-emitting diodes (OLEDs), which can emit light themselves, has been spotlighted due to its numerous advantages such as fast response speed, an excellent luminous efficiency, excellent brightness, and wide viewing angles.

The organic light-emitting display device may include a flexible substrate, which contains a flexible polymer material, and may thus be bendable, foldable, or rollable.

However, when the organic light-emitting display device is bent, wires may be stressed in the bending area of the organic light-emitting display device.

The above information disclosed in this Background section is only for understanding of the background of the inventive concepts, and, therefore, it may contain information that does not constitute prior art.

SUMMARY

Devices constructed according to exemplary embodiments of the invention are capable of reducing damage to wires in the bending area thereof.

However, exemplary embodiments are not restricted to those set forth herein. Additional features of the inventive concepts will be set forth in the description which follows, and in part will be apparent from the description, or may be learned by practice of the inventive concepts.

According to one or more embodiments of the invention, a display device has a display area and a non-display area disposed in the vicinity of the display area and includes a bending area, the display device including: a substrate; a first organic insulating layer disposed on the substrate; and a trench structure disposed in the non-display area, the trench structure including sidewalls formed by the first organic insulating layer and a bottom surface located in the bending area, wherein the bending area is disposed on a side of the display area.

The display device may further include: a first bending connection area disposed on a first side of the bending area and located between the bending area and the display area; and a second bending connection area disposed on a second side of the bending area.

The sidewalls of the trench structure may include a first sidewall disposed on a first side of the trench structure and a second sidewall disposed on a second side of the trench structure.

The first sidewall may be located in the first bending connection area, and the second sidewall may be located in the second bending connection area.

The first sidewall may be located at a boundary between the bending area and the first bending connection area, and the second sidewall may be located at a boundary between the bending area and the second bending connection area.

The first and second sidewalls may be located in the bending area.

The display device may further include: a second organic insulating layer disposed between the first organic insulating layer and the substrate.

The bottom surface of the trench structure may be formed by the second organic insulating layer.

The bottom surface of the trench structure may be formed by the first organic insulating layer, and a thickness of the first organic insulating layer at the bottom surface of the trench structure may be smaller than a thickness of the first organic insulating layer on the sidewalls of the trench structure.

The bottom surface of the trench structure may include an uneven structure.

The bottom surface of the trench structure may include a concavely curved surface.

The display device may include a first side extending along a first direction and a second side extending along a second direction intersecting the first direction, and the bending area may be located in the first direction with respect to the display area.

A width of the trench structure, in the second direction, may be the same as a width of the bending area, in the second direction.

The trench structure may include a plurality of sub-trench structures isolated from one another in the second direction.

The trench structure may include a plurality of sub-trench structures isolated from one another in the first direction.

The display device may further include: an inorganic insulating layer disposed between the first organic insulating layer and the substrate, the inorganic insulating layer including an inorganic insulating opening, which exposes the substrate, wherein the inorganic insulating opening may overlap with the trench structure.

The display device may further include: a third organic insulating layer filling the inorganic insulating opening and disposed between the substrate and the first organic insulating layer.

The trench structure may completely overlap with the inorganic insulating opening.

According to one or more embodiments of the invention, a display device having a display area and a non-display area includes: a substrate having a bending area in the non-display area; a first insulating layer disposed on the substrate; a first opening formed in the first insulating layer exposing the substrate and overlapping with the bending area; a second insulating layer filling the first opening; a first organic material layer disposed on the second insulating layer and overlapping with the bending area; and a second organic material layer disposed on the first organic material layer, the second organic material layer including a second opening, which overlaps with the bending area.

The display device may further include: a protective film disposed on a rear surface of the substrate and not overlapping with the bending area.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
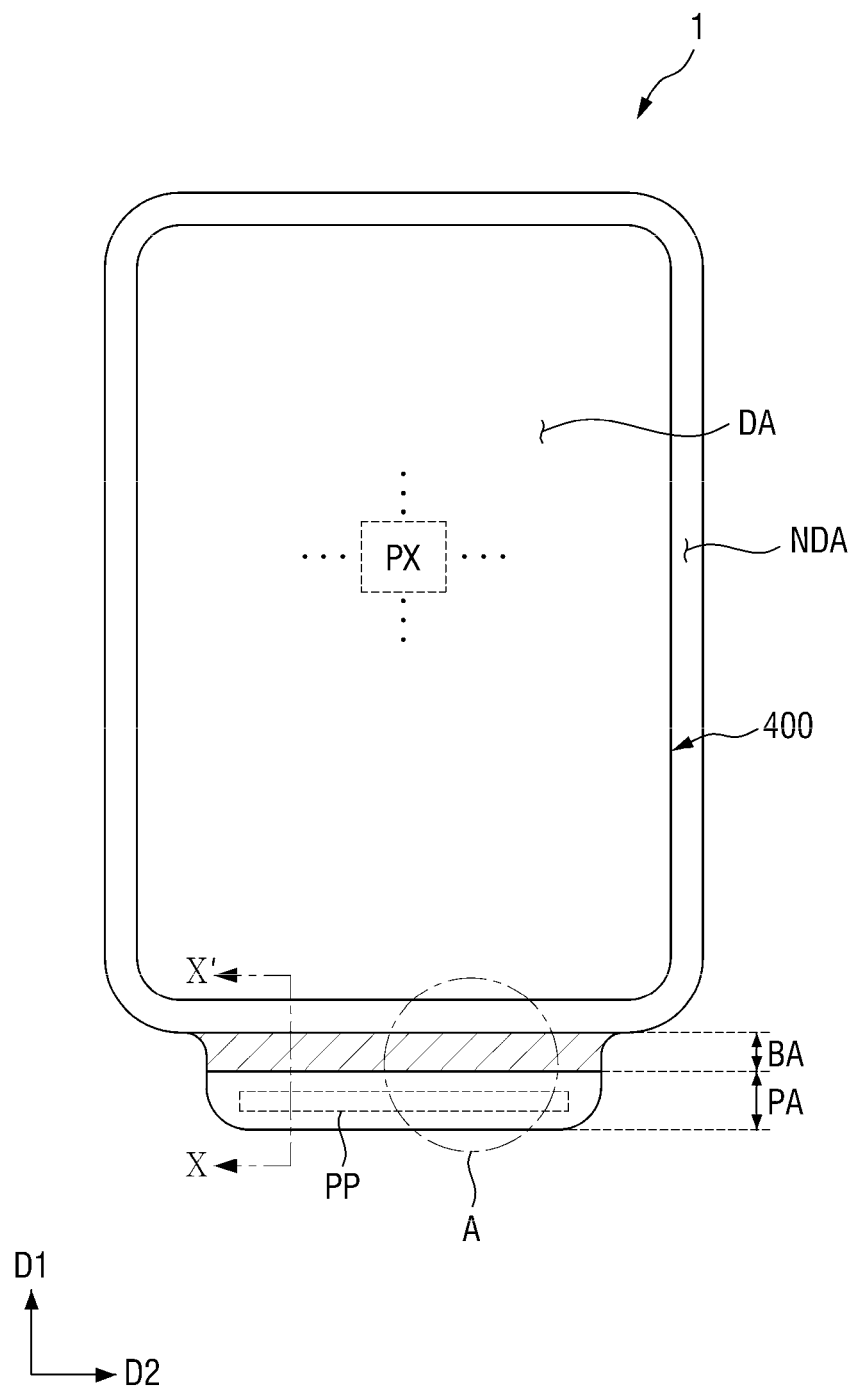
FIG. 1 is a plan view of an organic light-emitting display device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis and the D2-axis are not limited to three axes of a rectangular coordinate system, such as the x, y, and z-axes, and may be interpreted in a broader sense. For example, the D1-axis and the D2-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, exemplary embodiments of the present invention will be described in detail with reference to the accompanying drawings.

Figure 2:
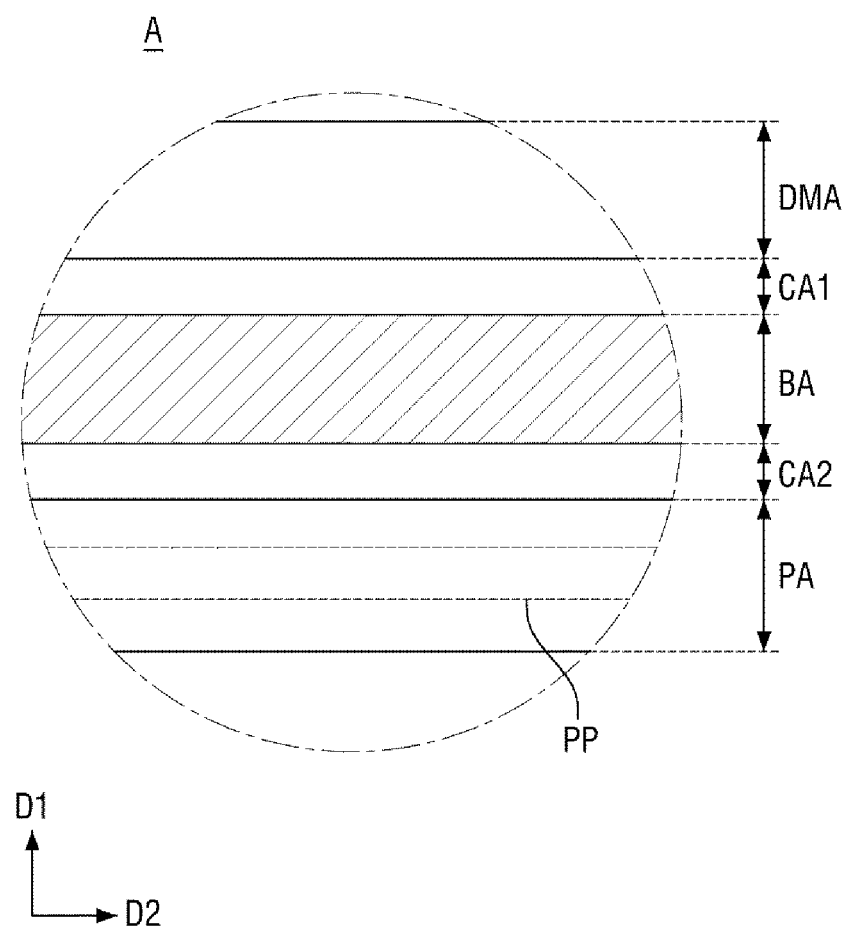
FIG. 2 is an enlarged view of an area A of FIG. 1.
Figure 3:
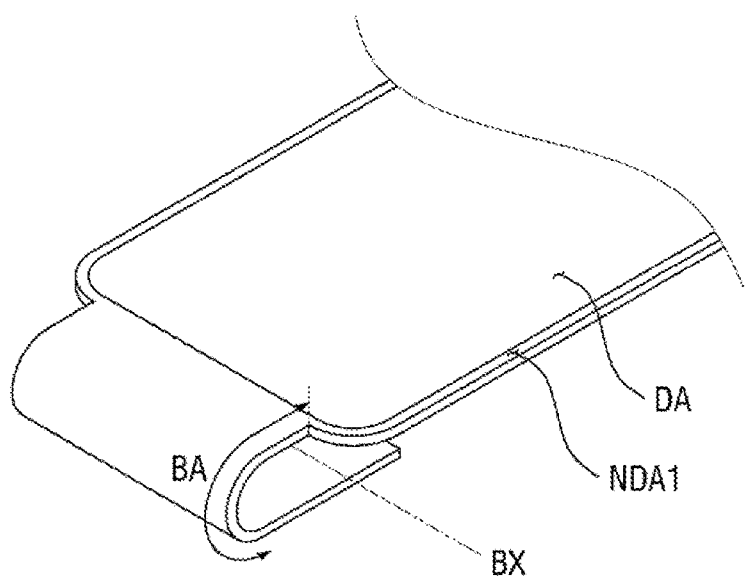
FIG. 3 is a perspective view showing the organic light-emitting display device of FIG. 1 in a state of being bent.

FIG. 1 is a plan view of an organic light-emitting display device according to an exemplary embodiment. FIG. 2 is an enlarged view of an area A of FIG. 1. FIG. 3 is a perspective view showing the organic light-emitting display device of FIG. 1 in a state of being bent.

Referring to FIG. 1, an organic light-emitting display device 1 includes a display area DA and a non-display area NDA. The display area DA includes a plurality of pixels PX. The display area DA may include a thin-film encapsulation layer 400. The thin-film encapsulation layer 400 may protect a light-emitting element (i.e., light-emitting member 320 of FIG. 4) of each pixel PX by blocking the infiltration of oxygen and moisture.

The non-display area NDA is a peripheral area adjacent to the display area DA. The non-display area NDA is disposed in the vicinity of the display area DA. The non-display area NDA may include a bending area BA and a pad area PA. The non-display area NDA may have an extended portion on one side (for example, the bottom side) thereof. The extended portion of the non-display area NDA may include the pad area PA. The pad area PA may include a pad portion PP, which receives external signals. The pad area PA may be formed on one side of the non-display area NDA and may also be formed on the other side of the non-display area NDA. The bending area BA may be located between the display area DA and the pad area PA. The bending area BA is an area where the organic light-emitting display device 1 is bent, and may extend in a first direction D1.

An area A of FIG. 1 includes a part of the extended portion of the non-display area NDA. Referring to FIG. 2, which is an enlarged view of the area A of FIG. 1, the non-display area NDA includes the bending area BA and the pad area PA. The bending area BA is an area where the organic light-emitting display device 1 is physically bent, and is spaced apart from the display area DA. Bending connection areas CA1 and CA2 may be located adjacent to the bending area BA. The bending area BA may include a first opening (OP1 of FIG. 4) from which a plurality of insulating films are removed. The bending connection areas CA1 and CA2 may include a first bending connection area CA1, which adjoins the display area DA to the bending area BA, and a second bending connection area CA2, which adjoins the pad area PA to the bending area BA.

The non-display area NDA may include a dam area DMA, which is located between the first bending connection area CA1 and the display area DA. The dam area DMA may include first and second dam portions DM1 and DM2. In a case where a thin-film encapsulation layer 400 is formed in the display area DA, the dam area DMA prevents or reduces an organic material layer (i.e., organic encapsulation layer 420 of FIG. 4) from spilling over to the outside of the dam area DMA (particularly, to the first bending connection area CA1). Although not specifically illustrated, another dam areas may also be provided on, for example, the top, left, and right sides of the display area DA.

One side of the first bending connection area CA1 may be connected to the dam area DMA, and the other side of the first bending connection area CA1 may be connected to the bending area BA. One side of the second bending connection area CA2 may be connected to the bending area BA, and the other side of the second bending connection area CA2 may be connected to the pad area PA.

Referring to FIG. 3, the bending area BA may be bent along a bending axis BX. The bending axis BX may be a straight line perpendicular to the direction in which the bending area BA extends, and may be parallel to one side of the display area DA, particularly, the bottom side of the display area DA according to the exemplary embodiment. The bending axis BX may be disposed below the plane where the pixels PX are disposed. The organic light-emitting display device 1 may be bent along the bending axis BX, and as a result, the pad area PA may be disposed to overlap with the rear side of the display area DA. If the pad area PA is located on the rear side of the display area DA, the dead space of the organic light-emitting display device 1 can be reduced.

Figure 4:
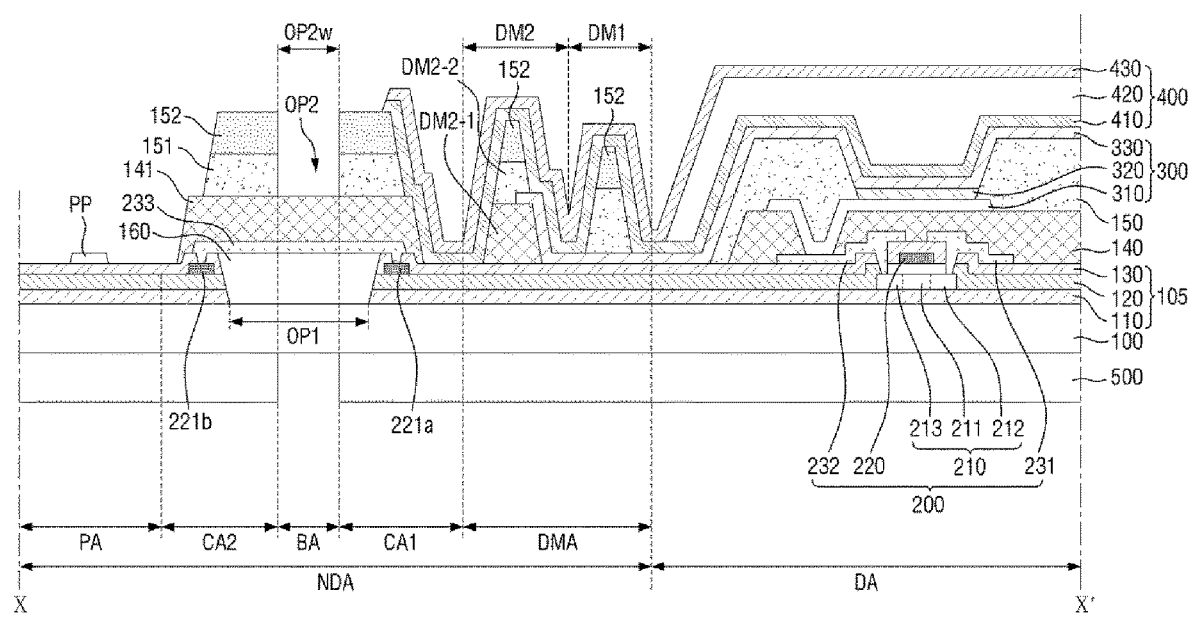
FIG. 4 is a cross-sectional view taken along a sectional line X-X' of FIG. 1.

FIG. 4 is a cross-sectional view taken along line X-X' of FIG. 1. The structure of the organic light-emitting display device 1 will hereinafter be described with reference to FIG. 4.

The organic light-emitting display device 1 includes a flexible substrate 100 and a plurality of layers formed on the flexible substrate 100. The flexible substrate 100 supports the plurality of layers formed thereon. The flexible substrate 100 may be a substrate that is bendable, foldable, or rollable.

The flexible substrate 100 may be formed of, for example, polyimide (PI), but the present disclosure is not limited thereto.

A buffer layer 110 may be disposed on the flexible substrate 100. The buffer layer 110 may prevent or reduce the diffusion of impurity ions and the infiltration of moisture and outside air and may perform a surface planarization function. The buffer layer 110 may include silicon oxide, silicon nitride, or silicon oxynitride. The buffer layer 110 may cover most of the display area DA and the non-display area NDA of the flexible substrate 100, but may be removed from parts of the flexible substrate 100 to expose the surface of the flexible substrate 100. The parts of the flexible substrate 100 from which the buffer layer 110 is removed may include the entire bending area BA and at least part of each of the first and second bending connection areas CA1 and CA2, but the present disclosure is not limited thereto. That is, the buffer layer 110 may be removed only from the bending area BA.

The buffer layer 110 may not be provided depending on the type of the flexible substrate 100 or process conditions.

A semiconductor layer 210 may be disposed on the buffer layer 110. The semiconductor layer 210 may include a source region 212, a drain region 213, and a channel region 211. In one exemplary embodiment, the semiconductor layer 210 may include polycrystalline silicon. The polycrystalline silicon may be formed by crystallizing amorphous silicon. Examples of a crystallization method used to form the polycrystalline silicon include rapid thermal annealing (RTA), solid phase crystallization (SPC), excimer laser annealing (ELA), metal induced crystallization (MIC), metal induced lateral crystallization (MILC), and sequential lateral solidification (SLS), but the present disclosure is not limited thereto. The source region 212 and the drain region 213 of the semiconductor layer 210 may be doped with impurity ions (for example, p-type impurity ions in the case of a p-type metal oxide semiconductor (PMOS) transistor), but the present disclosure is not limited thereto. A trivalent dopant such as boron (B) may be used as the p-type impurity ions.

In another exemplary embodiment, the semiconductor layer 210 may include monocrystalline silicon, low-temperature polycrystalline silicon, amorphous silicon, or an oxide semiconductor. Examples of the oxide semiconductor include a binary compound (ABx), a ternary compound (ABxCy), or a quaternary compound (ABxCyDz) containing indium (In), zinc (Zn), gallium (Ga), tin (Sn), titanium (Ti), aluminum (Al), hafnium (Hf), zirconium (Zr), or magnesium (Mg). In another exemplary embodiment, the semiconductor layer 210 may include indium tin zinc oxide (ITZO) or indium gallium zinc oxide (IGZO).

A gate insulating film 120 may be disposed on the semiconductor layer 210. The gate insulating film 120 may be interposed between the semiconductor layer 210 and a gate electrode 220 and may insulate the semiconductor layer 210 and the gate electrode 220 from each other. The gate insulating film 120 may include a silicon compound, a metal oxide, or the like. For example, the gate insulating film 120 may include silicon oxide, silicon nitride, silicon oxynitride, aluminum oxide, tantalum oxide, hafnium oxide, zirconium oxide, or titanium oxide, which may be used alone or in combination with one another. The gate insulating film 120 may be a single-layer film or a multilayer film having a stack of different materials.

The gate insulating film 120 may generally be disposed on the entire surface of the flexible substrate 100, but may be removed from the bending area BA and/or the first and second bending connection areas CA1 and CA2 together with the buffer layer 110 to expose the surface of the flexible substrate 100.

A first conductive layer (220, 221a, and 221b) is disposed on the gate insulating film 120. The first conductive layer (220, 221a, and 221b) includes the gate electrode 220, a first lower connecting wire 221a, and a second connecting lower wire 221b. The gate electrode 220 may form a first terminal of a thin-film transistor (TFT) 200. The first connecting lower wire 221a is disposed in the first bending connection area CA1, and the second connecting lower wire 221b is disposed in the second bending connection area CA2. The first and second lower wires 221a and 221b may be electrically connected to each other via an upper connecting wire 233.

The first conductive layer (220, 221a, and 221b) may include at least one metal selected from among molybdenum (Mo), Al, platinum (Pt), palladium (Pd), silver (Ag), Mg, gold (Au), nickel (Ni), neodymium (Nd), iridium (Ir), chromium (Cr), calcium (Ca), Ti, Ta, tungsten (W), and copper (Cu). The gate electrode 220 may be a single-layer film or a multilayer film.

An interlayer insulating film 130 insulates the first conductive layer (220, 221a, and 221b) and a second conductive layer (231, 232, and 233) from each other. The interlayer insulating film 130 may be disposed above the first conductive layer (220, 221a, and 221b). The interlayer insulating film 130 may generally be disposed on the entire surface of the flexible substrate 100, but may be removed from the first opening OP1 together with the buffer layer 110 and the gate insulating film 120 to expose the surface of the flexible substrate 100.

The interlayer insulating film 130 may be formed of an inorganic insulating material such as silicon oxide, silicon nitride, silicon oxynitride, hafnium oxide, aluminum oxide, titanium oxide, tantalum oxide, or zinc oxide.

The buffer layer 110, the gate insulating film 120, and the interlayer insulating film 130, which all include an inorganic material, will hereinafter be collectively referred to as an inorganic insulating layer 105. The inorganic insulating layer 105 may be disposed on the entire surface of the display area DA of the flexible substrate 100, except for the first opening OP1 where the bending area BA is located.

A first organic insulating layer 160 is disposed in the first opening OP1. The first organic insulating layer 160 may completely or partially fill the first opening OP1. The bottom surface of the first organic insulating layer 160 may be placed in contact with the top surface of the flexible substrate 100.

The first organic insulating layer 160 may include an organic insulating material such as an acrylic resin, an epoxy resin, a phenolic resin, a polyamide (PA) resin, a PI resin, an unsaturated polyester (PE) resin, a polyphenylene resin, a polyphenylene sulfide (PPS) resin, or benzocyclobutene (BCB).

The second conductive layer (231, 232, and 233) is disposed on the interlayer insulating film 130. The second conductive layer (231, 232, and 233) includes a source electrode 231, a drain electrode 232, and the upper connecting wire 233.

The source and drain electrodes 231 and 232 may be connected to the source and drain regions 212 and 213, respectively, via contact holes that penetrate the interlayer insulating film 130 and the gate insulating film 120.

The upper connecting wire 233 may be disposed to extend across the first organic insulating layer 160. The bottom surface of the upper connecting wire 233 may be placed in contact with the top surface of the first organic insulating layer 160. The upper connecting wire 233 is connected to the first and second lower wires 221a and 221b via contact holes in the first and second bending connection areas CA1 and CA2 that penetrate the interlayer insulating film 130 and the gate insulating film 120.

The second conductive layer (231, 232, and 233) may include at least one metal selected from among Al, Mo, Pt, Pd, Ag, Mg, Au, Ni, Nd, Ir, Cr, Ca, Ti, Ta, W, and Cu. The second conductive layer (231, 232, and 233) may be a single-layer film or a multilayer film. For example, the second conductive layer (231, 232, and 233) may be formed as a stack structure of Ti/Al/Ti, Mo/Al/Mo, Mo/AlGe/Mo, or Ti/Cu.

The upper connecting wire 233 may be formed of a metal having a smaller Young's modulus than the first and second lower connecting wires 221a and 221b. For example, the first and second lower connecting wires 221a and 221b may be formed of a Mo-based metal such Mo or a Mo alloy. The upper connecting wire 233 may be formed of an Al-based metal having a low Young's modulus such as Al or an Al alloy. Since the upper connecting wire 233, which overlaps with the bending area BA, has low stress for strain, the risk that the upper connecting wire 233 will be disconnected or deteriorate when being bent can be reduced. The upper connecting wire 233 may have a triple-layer structure of Ti/Al/Ti.

The TFT 200 may include the semiconductor layer 210, the gate electrode 220, the source electrode 231, and the drain electrode 232. The TFT 200 may be a driving transistor of a pixel circuit of the organic light-emitting display device 1. Since the gate electrode 220 is disposed above the semiconductor layer 210, the TFT 200 may be referred to as a top gate-type TFT. However, the structure of the TFT 200 is not particularly limited, but may vary.

A second organic insulating layer 140 and 141 may be disposed on the second conductive layer (231, 232, and 233). In the display area DA, the second organic insulating layer 140 may be provided as a via layer. As illustrated in FIG. 4, an organic light-emitting diode (OLED) 300 may be disposed above the TFT 200. In this case, the second organic insulating layer 140 may generally planarize the top of a passivation film covering the TFT 200.

In the dam area DMA, the second organic insulating layer 140 may be provided as a first layer DM2-1 of a second dam portion DM2.

In the bending area BA and the bending connection areas CA1 and CA2, the second organic insulating layer 141 may be provided on the upper connecting wire 233. The bottom surface of the second organic insulating layer 141 may be placed in contact with the top surface of the upper connecting wire 233.

The second organic insulating layer 140 and 141 may include an acrylic resin, an epoxy resin, a phenolic resin, a PA resin, a PI resin, an unsaturated PE resin, a polyphenylene resin, a PPS resin, or BCB.

In the display area DA of the flexible substrate 100, the OLED 300 may be disposed on the second organic insulating layer 140. The OLED 300 may include a pixel electrode 310, a common electrode 330, and a light-emitting member 320 interposed between the pixel electrode 310 and the common electrode 330. The pixel electrode 310 may be disposed on the second organic insulating layer 140. The pixel electrode 310 may be electrically connected to the drain electrode 232 through a contact hole that penetrates the second organic insulating layer 140.

The pixel electrode 310 may be, but is not limited to, a stack of a material having a high work function such as indium tin oxide (ITO), indium zinc oxide (IZO), zinc oxide (ZnO), or indium oxide ($In_2O_3$) and a reflective material such as Ag, Mg, Al, Pt, lead (Pd), Au, Ni, Nd, Ir, Cr, Li, Ca, or a mixture thereof. The pixel electrode 310 may have a multilayer structure including ITO/Mg, ITO/MgF, ITO/Ag, or ITO/Ag/ITO, but the present disclosure is not limited thereto.

A third organic insulating layer 150 and 151 may be disposed on the second organic insulating layer 140 and 141. In the display area DA, the third organic insulating layer 150 may be provided as a pixel-defining film. The third organic insulating layer 150 may include an opening exposing the pixel electrode 310.

In the dam area DMA, the first dam portion DM1 may be formed as a single-layer film, in which case, the first dam portion DM1 and the third organic insulating layer 150 may be formed at the same time.

In the bending area BA and the bending connection areas CA1 and CA2, the third organic insulating layer 151 may be disposed on the second organic insulating layer 141. The third organic insulating layer 151 can effectively prevent or reduce the infiltration of external impurities into the first and second lower connecting wires 221a and 221b and into the upper connecting wire 233.

The third organic insulating layer 150 and 151 may include an organic insulating material such as an acrylic resin, an epoxy resin, a phenolic resin, a PA resin, a PI resin, an unsaturated PE resin, a polyphenylene resin, a PPS resin, or BCB. The third organic insulating layer 150 and 151 may further include an inorganic insulating material such as silicon oxide, silicon nitride, silicon oxynitride, hafnium oxide, aluminum oxide, titanium oxide, tantalum oxide, or zinc oxide. The third organic insulating layer 150 and 151 may be a single-layer film or a multilayer film having a stack of different materials.

The light-emitting member 320 is disposed in the opening of the third organic insulating layer 150. Although not specifically illustrated, the light-emitting member 320 may include an organic emission layer, hole injection and transfer layers, and electron injection and transfer layers.

The common electrode 330 is disposed on the third organic insulating layer 150 and on the light-emitting member 320. The common electrode 330 may be disposed across the entire display area DA. The common electrode 330 may include a low-work function material layer including, for example, lithium (Li), Ca, LiF/Ca, LiF/Al, Al, Mg, Ag, Pt, Pd, Ni, Au Nd, Ir, Cr, BaF, barium (Ba), or a compound or mixture thereof (for example, the mixture of Ag and Mg). The common electrode 330 may further include a transparent metal oxide layer disposed on the low-work function material layer.

The thin-film encapsulation layer 400 is disposed on the common electrode 330. The thin-film encapsulation layer 400 covers the OLED 300 and prevents or reduces the exposure of the OLED 300 to external moisture or oxygen. The thin-film encapsulation layer 400 may cover the entire display area DA. The thin-film encapsulation layer 400 may include a first inorganic encapsulation layer 410, an organic encapsulation layer 420, and a second inorganic encapsulation layer 430.

The first inorganic encapsulation layer 410 may be disposed on the common electrode 330. The first inorganic encapsulation layer 410 may include silicon oxide, silicon nitride, and silicon oxynitride. The organic encapsulation layer 420 may be disposed on the first inorganic encapsulation layer 410. The organic encapsulation layer 420 may planarize the top surface of the display area DA. The organic encapsulation layer 420 may include an organic material. For example, the organic encapsulation layer 420 may include at least one material selected from the group consisting of polyethylene terephthalate (PET), polyethylene naphthalate (PEN), polycarbonate (PC), PI, polyethylene sulfonate (PES), polyoxymethylene (POM), polyarylate, and hexamethyldisiloxane (HMDSO). The second inorganic encapsulation layer 430 may be disposed on the organic encapsulation layer 420. The second inorganic encapsulation layer 430 may include silicon oxide, silicon nitride, or silicon oxynitride. The second inorganic encapsulation layer 430 is placed in contact with the first inorganic encapsulation layer 410 outside the display area DA so as for the organic encapsulation layer 420 not to be exposed. That is, the first and second inorganic encapsulation layers 410 and 430 may be disposed in the dam area DMA and the first bending connection area CA1 outside the display area DA.

The first and second dam portions DM1 and DM2 in the dam area DMA may further include a fourth organic insulating layer 152. The fourth organic insulating layer 152 may be a spacer. The first dam portion DM1, a second layer DM2-2 of the second dam portion DM2 and the third organic insulating layer 150 may be formed at the same time, and then, the fourth organic insulating layer 152 may be formed using the same mask used to form the first dam portion DM1, the second layer DM2-2 and the third organic insulating layer 150. Once the fourth organic insulating layer 152 is formed, the organic encapsulation layer 420 of the thin-film encapsulation layer 400 can be further effectively prevented or reduced from being spilling over to the outside of the display area DA.

In the bending area BA and the bending connection areas CA1 and CA2, the fourth organic insulating layer 152 may be disposed on the third organic insulating layer 151. After the formation of the third organic insulating layer 151, the fourth organic insulating layer 152 may be further formed using the same mask used to form the third organic insulating layer 151. Parts of the fourth organic insulating layer 152 in the bending area BA and the bending connection areas CA1 and CA2 and a part of the fourth organic insulating layer 152 in the dam area DMA may be formed at the same time.

The third organic insulating layer 151 may include a second opening OP2. The second opening OP2 may be formed in the bending area BA. Alternatively, the second opening OP2 may include the bending area BA.

The second opening OP2 may form a trench structure. Referring to FIG. 4, the sidewalls of the trench structure may include parts of the third organic insulating layer 151 on both sides of the second opening OP2. The sidewalls of the trench structure may be located in the bending area BA or in the bending connection areas CA1 and CA2. The sidewalls of the trench structure may be perpendicular to, or inclined with respect to, the bottom surface of the trench structure.

The bottom surface of the trench structure may be located in the bending area BA. The bottom surface of the trench structure may include the second organic insulating layer 141 and the third organic insulating layer 151. The bottom surface of the trench structure may be uneven or may be curved such that the bottom surface of the trench structure has a greatest height at the center of the bending area BA.

The third organic insulating layer 151 may be disposed to protect the first lower connecting wires 221a and 221b and the upper connecting wire 233. However, in the bending area BA, excessive stress may be applied to the upper connecting wire 233 due to the presence of the third organic insulating layer 151. The stress applied to the upper connecting wire 233 can be reduced by forming the second opening OP2, which overlaps with the bending area BA, in the third organic insulating layer 151.

The non-display area NDA, which has an extended portion on one side thereof, may include the pad area PA. The pad area PA may include the pad portion PP. A printed circuit board (PCB) or a flexible printed circuit board (FPCB) may be attached to the pad portion PP.

A protective film 500 may be disposed on the rear surface of the flexible substrate 100. The protective film 500 may be formed of a plastic material such as PET, PEN, PI, or PES, but the present disclosure is not limited thereto. The protective film 500 may be disposed to generally cover the rear surface of the flexible substrate 100, but may not be disposed in the bending area BA to reduce bending stress in the bending area BA.

The area of the first opening OP1 may be larger than the area of the bending area BA. That is, the width of the first opening OP1 may be greater than the width of the bending area BA. The area of the first opening OP1 may be defined as being smaller than the areas of the openings in the buffer layer 110, the gate insulating film 120, and the interlayer insulating film 130.

The first lower connecting wire 221a in the first bending connection area CA1 may be electrically connected to the TFT 200 in the display area DA. The second lower connecting wire 221b of the second bending connection area CA2 may be electrically connected to the pad portion PP in the pad area PA.

Figure 5:
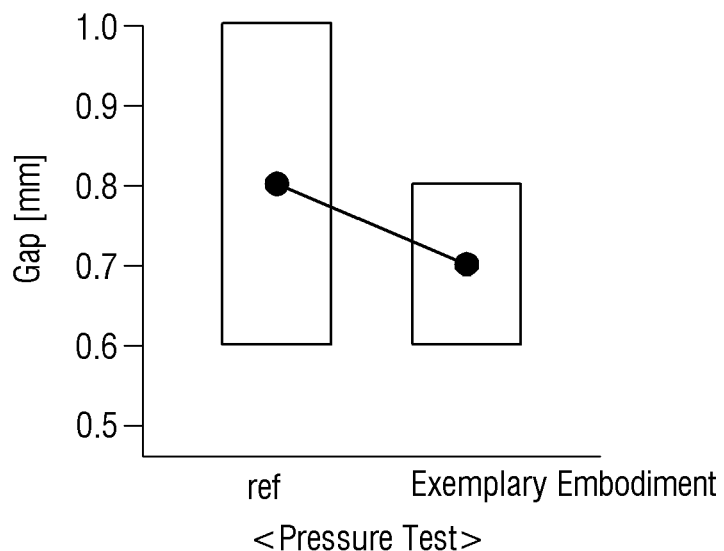
FIG. 5 is a graph comparing pressure test results obtained at the bending area of an organic light-emitting display device of FIG. 1 with pressure test results obtained at the bending area of the organic light-emitting display device according to a comparative example which does not include a second opening.
Figure 6:
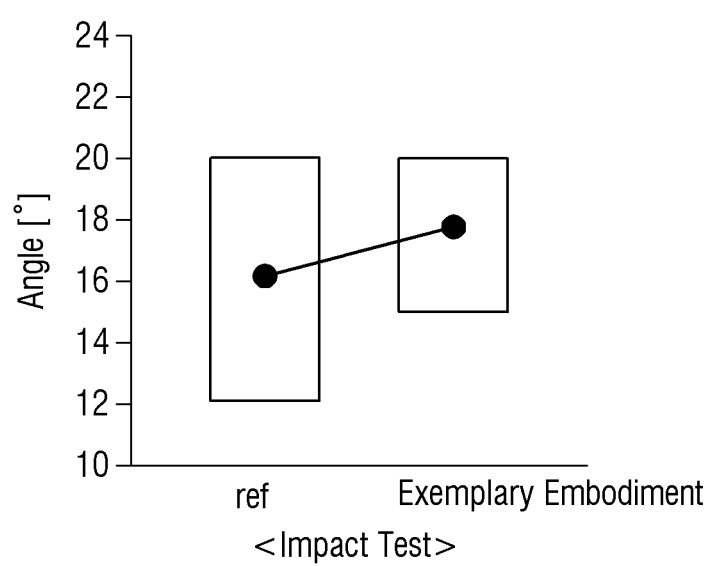
FIG. 6 is a graph comparing impact test results obtained at the bending area of the organic light-emitting display device of FIG. 1 with impact test results obtained at the bending area of the organic light-emitting display device according to a comparative example which does not include a second opening.

FIG. 5 is a graph comparing pressure test results obtained at the bending area of an organic light-emitting display device of FIG. 1 with pressure test results obtained at the bending area of the organic light-emitting display device according to a comparative example which does not include a second opening. FIG. 6 is a graph comparing impact test results obtained at the bending area of the organic light-emitting display device of FIG. 1 with impact test results obtained at the bending area of the organic light-emitting display device according to a comparative example which does not include a second opening. Referring to FIGS. 5 and 6, "ref" denotes to the organic light-emitting display device according to the comparative example in which the third organic insulating layer 151 does not include the second opening OP2.

Referring to FIG. 5, a pressure test may be performed by measuring the gap between the display area DA and the pad area PA at the time when a defect occurs, after bending the bending area BA of each organic light-emitting display device and then gradually applying pressure. The smaller the gap between the display area DA and the pad area PA is, the closer the display area DA and the pad area PA are to each other. The test results of the pressure test show that the average gap between the display area DA and the pad area PA is smaller in the organic light-emitting display device of FIG. 1 than in the organic light-emitting display device 1. This means that the organic light-emitting display device 1 has excellent bending characteristics as compared to the organic light-emitting display device according to a comparative example.

Referring to FIG. 6, an impact test may be performed by first bending the area BA of each organic light-emitting display device and hitting the bending area BA with a hammer at a predetermined angle away from the bending area BA, and measuring the angle of the bending area at the time when a defect occurs from the impact. The greater the angle of the bending area BA is, the more robust or resistant the bending area is against impact. The results of the impact test show that the average angle of the bending area BA is greater in the organic light-emitting display device 1 than in the organic light-emitting display device according to the comparative example. This means that the organic light-emitting display device 1 is more robust or resistant again the impact than the organic light-emitting display device according to a comparative example.

Figure 7:
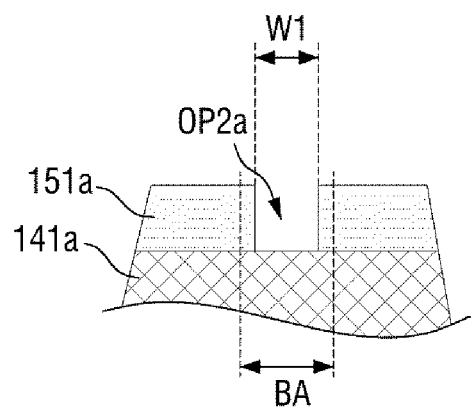
FIG. 7 is a cross-sectional view showing a third organic insulating layer and a second opening of an organic light-emitting display device according to an exemplary embodiment.

FIG. 7 is a cross-sectional view showing a third organic insulating layer 151a and a second opening OPA2a of an organic light-emitting display device according to an exemplary embodiment. The exemplary embodiment of FIG. 7 shows that a width W1 of a second opening OP2a may be smaller than the width of a bending area BA.

Referring to FIG. 7, the second opening OP2a forms a trench structure, and the sidewalls of the second opening OP2a are located in the bending area BA. The sidewalls of the second opening OP2a may be formed by a third organic insulating layer 151a. The bottom surface of the trench structure may be formed by a part of a second organic insulating layer 141a in the bending area BA.

In the exemplary embodiment of FIG. 7, the width W1 of the second opening OP2a is smaller than the width of the bending area BA, and the third organic insulating layer 151a, which has the same thickness inside and outside the bending area BA, is disposed in the bending area BA on both sides of the second opening OP2a. Accordingly, a flexible bending of an organic light-emitting display device can be induced due to the second opening OP2a accounting for most of the middle part of the bending area BA, bending stress can be reduced, and as a result, damage to wires in the bending area BA can be prevented or reduced. Also, the third organic insulating layer 151a, which is in the bending area BA on both sides of the second opening OP2a, can help maintain the strength of the bending area BA.

Figure 8:
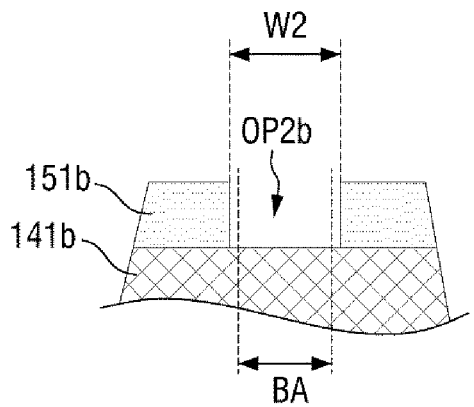
FIG. 8 is a cross-sectional view showing a third organic insulating layer and a second opening of an organic light-emitting display device according to an exemplary embodiment.

FIG. 8 is a cross-sectional view showing a third organic insulating layer 151b and a second opening OP2b of an organic light-emitting display device according to an exemplary embodiment. The exemplary embodiment of FIG. 8 shows that a width W2 of a second opening OP2b may be greater than the width of a bending area BA.

Referring to FIG. 8, the second opening OP2b forms a trench structure, and the sidewalls of the second opening OP2b are located outside the bending area BA. The sidewalls of the second opening OP2b may be formed by a third organic insulating layer 151b. The bottom surface of the trench structure may be formed by a part of a second organic insulating layer 141b in the bending area BA.

In the exemplary embodiment of FIG. 8, the width W2 of the second opening OP2b is greater than the width of the bending area BA, and the third organic insulating layer 151b is not disposed in the bending area BA. Accordingly, a flexible bending of an organic light-emitting display device can be induced due to the second opening OP2b having a greater width than the bending area BA, bending stress can be reduced, and as a result, damage to wires in the bending area BA can be prevented or reduced. Although not specifically illustrated in FIG. 8, the width W2 of the second opening OP2b may preferably be smaller than the width of lower connecting wires (221a and 221b of FIG. 4) because if the second opening OP2b is too wide, the lower connecting wires may easily become exposed to external moisture and impurities.

Figure 9:
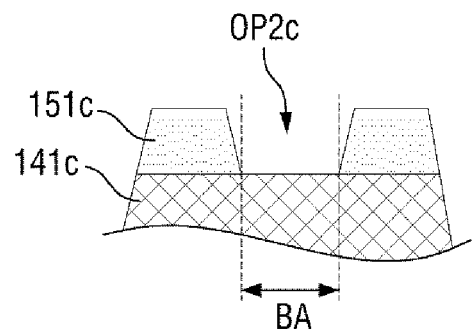
FIG. 9 is a cross-sectional view showing a third organic insulating layer and a second opening of an organic light-emitting display device according to an exemplary embodiment.

FIG. 9 is a cross-sectional view showing a third organic insulating layer 151c and a second opening OP2c of an organic light-emitting display device according to an exemplary embodiment. The exemplary embodiment of FIG. 9 shows that a second opening OP2c may have a reversed trapezoidal shape, rather than a rectangular shape.

Referring to FIG. 9, the second opening OP2c forms a trench structure, and the sidewalls of the second opening OP2c are inclined outside a bending area BA. The sidewalls of the second opening OP2c may be formed by a third organic insulating layer 151c. The bottom surface of the trench structure may be formed by a part of a second organic insulating layer 141c in the bending area BA.

In the exemplary embodiment of FIG. 9, the second opening OP2c has a reversed trapezoidal shape. Accordingly, the bottom surface of the third organic insulating layer 151c, placed in contact with the second organic insulating layer 141c, is larger than the top surface of the third organic insulating layer 151c, and lower connecting wires (221a and 221b of FIG. 4) outside the bending area BA can be effectively protected. Also, a flexible bending of an organic light-emitting display device can be induced due to the second opening OP2b having a reversed trapezoidal shape, and as a result, damage to wires in the bending area BA can be prevented or reduced.

Figure 10:
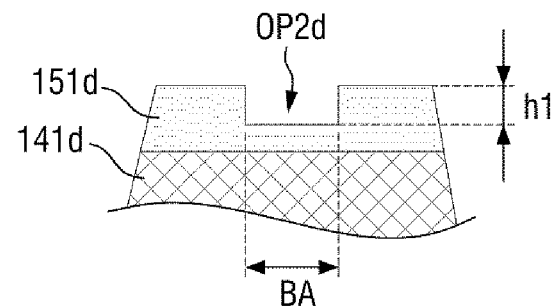
FIG. 10 is a cross-sectional view showing a third organic insulating layer and a second opening of an organic light-emitting display device according to an exemplary embodiment.

FIG. 10 is a cross-sectional view showing a third organic insulating layer 151d and a second opening OP2d of an organic light-emitting display device according to another exemplary embodiment. The exemplary embodiment of FIG. 10 shows that a height h1 of a second opening OP2d may be smaller than the height of a third organic insulating layer 151d.

Referring to FIG. 10, the second opening OP2d forms a trench structure, and the sidewalls of the second opening OP2d are aligned with the ends of a bending area BA. The sidewalls of the second opening OP2d may be formed by the third organic insulating layer 151d. The bottom surface of the trench structure may be formed by a part of the third organic insulating layer 151d in the bending area BA.

In the exemplary embodiment of FIG. 10, the height h1 of the second opening OP2d is smaller than the height of the third organic insulating layer 151d, and the width of the second opening OP2d is the same as the width of the bending area BA. Since a part of the third organic insulating layer 151d exists in the bending area BA, wires in the bending area BA can be effectively protected from external impurities.

Figure 11:
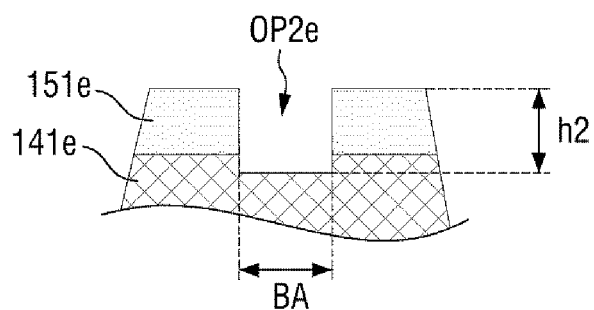
FIG. 11 is a cross-sectional view showing a third organic insulating layer and a second opening of an organic light-emitting display device according to an exemplary embodiment.

FIG. 11 is a cross-sectional view showing a third organic insulating layer 151e and a second opening OP2e of an organic light-emitting display device according to another exemplary embodiment. The exemplary embodiment of FIG. 11 shows that a height h2 of a second opening OP2e may be greater than the height of a third organic insulating layer 151e.

Referring to FIG. 11, the second opening OP2e forms a trench structure, and the sidewalls of the second opening OP2e are aligned with the ends of a bending area BA. The sidewalls of the second opening OP2e may be formed by the third organic insulating layer 151e. The bottom surface of the trench structure may be formed by a part of a second organic insulating layer 141e in the bending area BA.

In the exemplary embodiment of FIG. 11, the height h2 of the second opening OP2e is greater than the height of the third organic insulating layer 151e, and the width of the second opening OP2e is the same as the width of the bending area BA. Since only a part of the second organic insulating layer 141e exists in the bending area BA, a flexible bending of an organic light-emitting display device can be induced due to the second opening OP2e, bending stress can be reduced, and as a result, damage to wires in the bending area BA can be prevented or reduced. However, since only a part of the second organic insulating layer 141e exists in the bending area BA, the structure may provide a reduced protection to the wires in the bending area BA, but the exemplary embodiment may have an improved rigidity and reduced infiltration of external impurities into connecting wires in the bending area BA.

Figure 12:
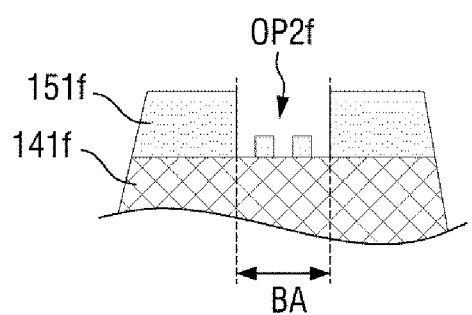
FIG. 12 is a cross-sectional view showing a third organic insulating layer and a second opening of an organic light-emitting display device according to an exemplary embodiment.

FIG. 12 is a cross-sectional view showing a third organic insulating layer 151f and a second opening OP2f of an organic light-emitting display device according to another exemplary embodiment. The exemplary embodiment of FIG. 12 shows that the bottom surface of a second opening OP2f may include an uneven structure.

Referring to FIG. 12, the second opening OP2f forms a trench structure, and the sidewalls of the second opening OP2f are aligned with the ends of a bending area BA. The sidewalls of the second opening OP2f may be formed by a third organic insulating layer 151f. The bottom surface of the trench structure may be formed by parts of a second organic insulating layer 141f and the third organic insulating layer 151d in the bending area BA. For example, recessed parts of the uneven structure may be formed by the second organic insulating layer 141f, and protruding parts of the uneven structure may be formed by the third organic insulating layer 151f.

In the exemplary embodiment of FIG. 12, the width of the second opening OP2f is the same as the width of the bending area BA, and the uneven structure formed by the third organic insulating layer 151f is disposed on the top surface of the second organic insulating layer 141f in the bending area BA. Accordingly, a flexible bending of an organic light-emitting display device can be induced due to the second opening OP2f, bending stress can be reduced, and as a result, damage to wires in the bending area BA can be prevented or reduced.

Figure 13:
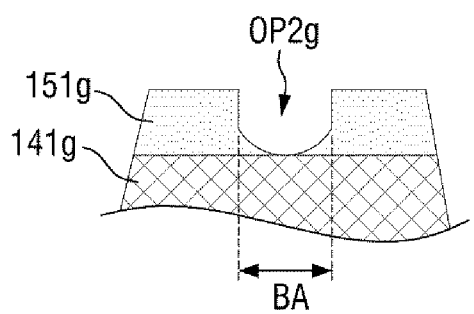
FIG. 13 is a cross-sectional view showing a third organic insulating layer and a second opening of an organic light-emitting display device according to an exemplary embodiment.

FIG. 13 is a cross-sectional view showing a third organic insulating layer 151g and a second opening OP2g of an organic light-emitting display device according to another exemplary embodiment. The exemplary embodiment of FIG. 13 shows that the bottom surface of a second opening OP2g may be curved.

Referring to FIG. 13, the second opening OP2g forms a trench structure, and the sidewalls of the second opening OP2g are aligned with the ends of a bending area BA. The sidewalls of the second opening OP2g may be formed by a third organic insulating layer 151g. The bottom surface of the trench structure may be curved and may be formed by a part of the third organic insulating layer 151g in the bending area BA.

In the exemplary embodiment of FIG. 13, the height of the bottom of the second opening OP2g may be greater on the sides of the second opening OP2g than at the center of the second opening OP2g. Accordingly, a flexible bending of an organic light-emitting display device can be induced due to the second opening OP2g accounting for the central part of the bending area BA, and lower connecting wires (221a and 221b of FIG. 4) outside the bending area BA can be protected.

Figure 14:
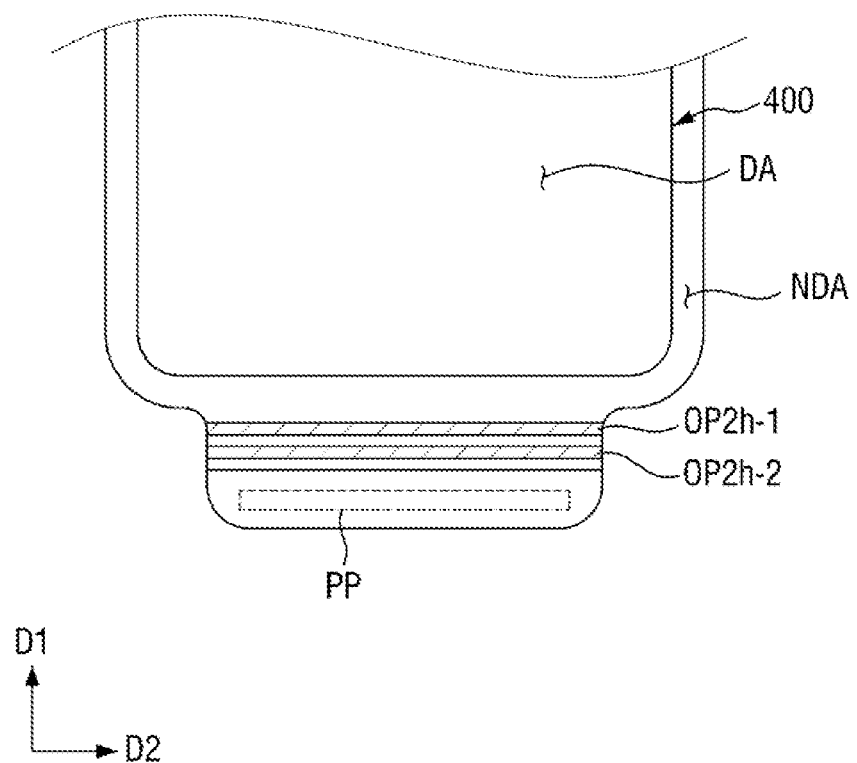
FIG. 14 is a plan view of a display device according to an exemplary embodiment, which includes a plurality of second openings.

FIG. 14 is a plan view of a display device according to an exemplary embodiment, which includes a plurality of second openings. The exemplary embodiment of FIG. 14 shows that a plurality of second openings OP2h-1 and OP2h-2, which are isolated from each other in a first direction D1, may be disposed in a bending area BA.

Referring to FIG. 14, the second openings OP2h-1 and OP2h-2 are disposed between a display area DA and a pad portion PP. Although not specifically illustrated, each of the second openings OP2h-1 and OP2h-2 forms a trench structure, and the width, in the first direction D1, of the second openings OP2h-1 and OP2h-2 may be the same as the width of the bending area BA.

In the exemplary embodiment of FIG. 14, two second openings, i.e., the second openings OP2h-1 and OP2h-2, each forming a trench structure, are provided. Accordingly, a flexible bending of an organic light-emitting display device can be induced, bending stress can be reduced, and as a result, damage to wires in the bending area BA can be prevented or reduced.

Figure 15:
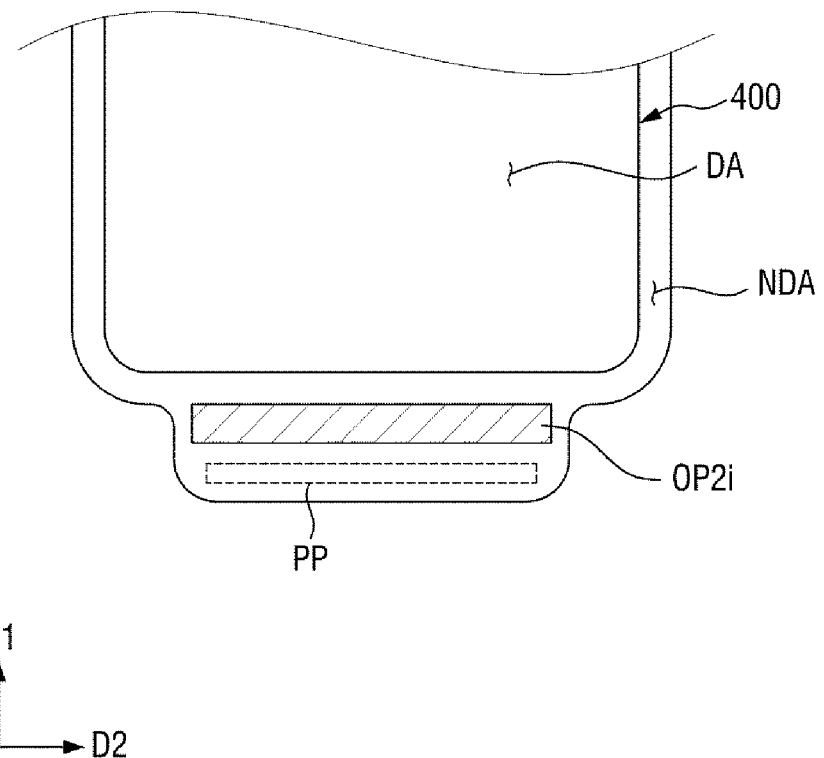
FIG. 15 is a plan view of a display device according to an exemplary embodiment, which includes a second opening.

FIG. 15 is a plan view of a display device according to an exemplary embodiment, which includes a second opening. The exemplary embodiment of FIG. 15 shows that a second opening OP2i may not extend to the sides of a bending area BA in a second direction D2 and may have a uniform width in a second first direction D1.

Referring to FIG. 15, although not specifically illustrated, the second opening OP2i forms a trench structure. The length, in the second direction D2, of the opening OP2i is smaller than the length of a bending area BA, and the width, in the second first direction D1, of the second opening OP2i is the same as the width of the bending area BA.

In the exemplary embodiment of FIG. 15, the second opening OP2i does not extend to the sides of the bending area BA in the second direction D2 to have the same length as the bending area BA. Accordingly, the infiltration of external impurities into connecting wires in the bending area BA can be prevented or reduced.

Figure 16:
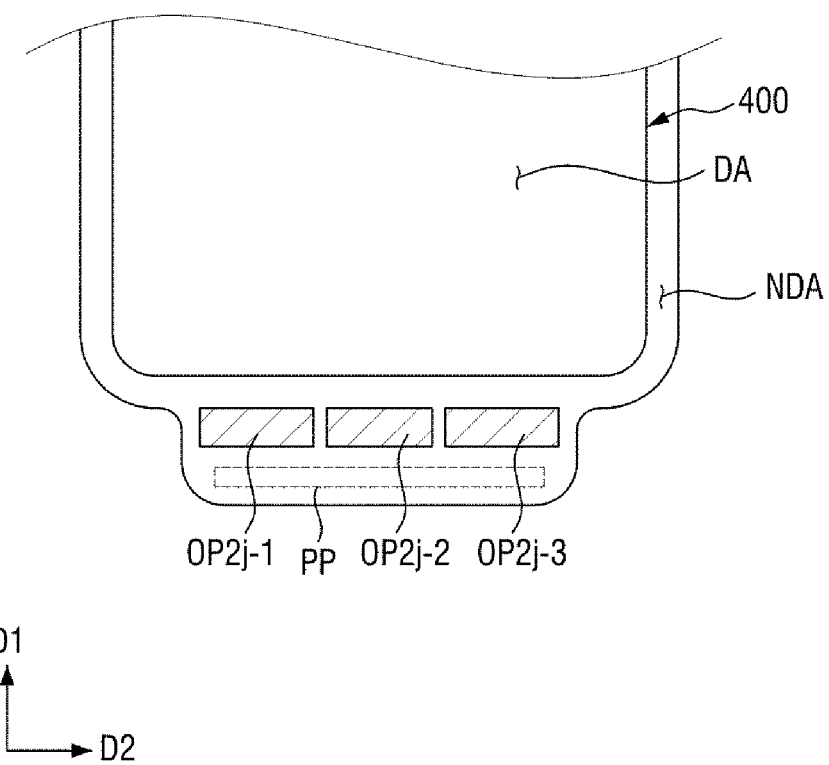
FIG. 16 is a plan view of a display device according to an exemplary embodiment, which includes a plurality of second openings.

FIG. 16 is a plan view of a display device according to an exemplary embodiment, which includes a plurality of second openings. The exemplary embodiment of FIG. 16 shows that a plurality of second openings OP2j-1, OP2j-2, and OP2j-3, which are isolated from one another in a second direction D2, may be disposed in a bending area BA.

Referring to FIG. 16, the second openings OP2j-1, OP2j-2, and OP2j-3 are disposed between a display area DA and a pad portion PP. Although not specifically illustrated, each of the second openings OP2j-1, OP2j-2, and OP2j-3 forms a trench structure, and the width, in the second direction D2, of the second openings OP2j-1, OP2j-2, and OP2j-3 may be the same as the width of the bending area BA.

In the exemplary embodiment of FIG. 16, three second openings each forming a trench structure, i.e., the second openings OP2j-1, OP2j-2, and OP2j-3, are provided. Accordingly, a flexible bending of an organic light-emitting display device can be further induced as compared to the exemplary embodiment where two second openings are provided, bending stress can be reduced, and as a result, damage to wires in the bending area BA can be is prevented or reduced.

Some of the advantages that may be achieved by exemplary implementations/embodiments of the invention and/or exemplary methods of the invention include reduced damage to wires in a bending area of a display device.

In the above description, the present invention has been described based on the exemplary embodiments, but the exemplary embodiments are for illustrative, and do not limit the present invention, and those skilled in the art will appreciate that various modifications and applications, which are not exemplified in the above description, may be made without departing from the scope of the essential characteristic of the present exemplary embodiments. For example, each component described in detail in the exemplary embodiment can be modified and executed. Therefore, it should be construed that contents associated with the combination and modification are included in the scope of the present invention.

What is claimed is:

1. A display device having a display area and a non-display area disposed in a vicinity of the display area and comprising a bending area, the display device comprising:
   a substrate;
   a third organic insulating layer disposed on the substrate;
   an inorganic insulating layer disposed between the third organic insulating layer and the substrate and including an inorganic insulating opening which exposes the substrate;
   a first organic insulating layer at least partially filling the inorganic insulating opening and contacting the substrate;
   a second organic insulating layer disposed between the third organic insulating layer and the substrate; and
   a trench structure disposed in the non-display area, the trench structure comprising an uncovered open top, sidewalls formed by the third organic insulating layer, and a bottom surface located in the bending area,
   wherein the bending area is disposed on a side of the display area,
   wherein the non-display area further includes a dam area between the bending area and the display area,
   wherein a dam portion including the third organic insulating layer is disposed in the dam area,
   wherein the inorganic insulating opening overlaps with the trench structure and a width of the inorganic insulating opening is greater than a width of the trench structure,
   wherein the display device comprises a first side extending along a first direction and a second side extending along a second direction intersecting the first direction,
   wherein the bending area is located in the first direction with respect to the display area,
   wherein a length of the bending area is greater than a length of the trench in the second direction, and
   wherein a width of the trench, in the first direction, is the same as a width of the bending area, in the first direction.

2. The display device of claim 1, further comprising:
   a first bending connection area disposed on a first side of the bending area and located between the bending area and the display area; and
   a second bending connection area disposed on a second side of the bending area.

3. The display device of claim 2, wherein the sidewalls of the trench structure comprise a first sidewall disposed on a first side of the trench structure and a second sidewall disposed on a second side of the trench structure.

4. The display device of claim 3, wherein
   the first sidewall is located in the first bending connection area, and
   the second sidewall is located in the second bending connection area.

5. The display device of claim 3, wherein the first sidewall is located at a boundary between the bending area and the first bending connection area, and
   wherein the second sidewall is located at a boundary between the bending area and the second bending connection area.

6. The display device of claim 1, wherein the bottom surface of the trench structure is formed by the second organic insulating layer.

7. The display device of claim 1, wherein the bottom surface of the trench structure is formed by the third organic insulating layer, and wherein a thickness of the third organic insulating layer at the bottom surface of the trench structure is smaller than a thickness of the third organic insulating layer on the sidewalls of the trench structure.

8. The display device of claim 7, wherein the bottom surface of the trench structure comprises an uneven structure.

9. The display device of claim 7, wherein the bottom surface of the trench structure comprises a concavely curved surface.

10. The display device of claim 1, wherein the trench structure comprises a plurality of sub-trench structures isolated from one another in the first direction.

11. The display device of claim 1,
    wherein the first organic insulating layer completely fills the inorganic insulating opening and is disposed between the substrate and the third organic insulating layer.

12. The display device of claim 1, wherein the trench structure completely overlaps with the inorganic insulating opening.

* * * * *